United States Patent
Han et al.

(10) Patent No.: US 10,553,427 B2
(45) Date of Patent: Feb. 4, 2020

(54) LOW DIELECTRIC CONSTANT OXIDE AND LOW RESISTANCE OP STACK FOR 3D NAND APPLICATION

(71) Applicant: Applied Materials, Inc., Santa Clara, CA (US)

(72) Inventors: Xinhai Han, Santa Clara, CA (US); Kang Sub Yim, Palo Alto, CA (US); Zhijun Jiang, Sunnyvale, CA (US); Deenesh Padhi, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/958,747

(22) Filed: Apr. 20, 2018

(65) Prior Publication Data

US 2018/0315592 A1 Nov. 1, 2018

Related U.S. Application Data

(60) Provisional application No. 62/490,725, filed on Apr. 27, 2017.

(51) Int. Cl.
*H01L 21/02* (2006.01)
*C23C 16/40* (2006.01)
(Continued)

(52) U.S. Cl.
CPC .......... *H01L 21/0262* (2013.01); *C23C 16/24* (2013.01); *C23C 16/401* (2013.01);
(Continued)

(58) Field of Classification Search
CPC combination set(s) only.
See application file for complete search history.

(56) References Cited

U.S. PATENT DOCUMENTS

| 6,074,919 A | * | 6/2000 | Gardner | ............ H01L 21/28052 |
| | | | | 257/E21.199 |
| 7,259,111 B2 | | 8/2007 | Padhi et al. | |

(Continued)

OTHER PUBLICATIONS

International Search Report and Written Opinion dated Aug. 8, 2018 for Application No. PCT/US2018/028632.
(Continued)

*Primary Examiner* — Moin M Rahman
(74) *Attorney, Agent, or Firm* — Patterson + Sheridan LLP

(57) ABSTRACT

Embodiments described herein generally relate to methods of manufacturing an oxide/polysilicon (OP) stack of a 3D memory cell for memory devices, such as NAND devices. The methods generally include treatment of the oxide and/or polysilicon materials with precursors during PECVD processes to lower the dielectric constant of the oxide and reduce the resistivity of the polysilicon. In one embodiment, the oxide material is treated with octamethylcyclotetrasiloxane (OMCTS) precursor. In another embodiment, germane (GeH$_4$) is introduced to a PECVD process to form Si$_x$Ge$_{(1-x)}$ films with dopant. In yet another embodiment, a plasma treatment process is used to nitridate the interface between layers of the OP stack. The precursors and plasma treatment may be used alone or in any combination to produce OP stacks with low dielectric constant oxide and low resistivity polysilicon.

7 Claims, 3 Drawing Sheets

(51) Int. Cl.
*C23C 16/24* (2006.01)
*C23C 16/505* (2006.01)
*C23C 28/00* (2006.01)
*C23C 28/04* (2006.01)

(52) U.S. Cl.
CPC ............ *C23C 16/505* (2013.01); *C23C 28/00* (2013.01); *C23C 28/04* (2013.01); *C23C 28/42* (2013.01); *C23C 28/44* (2013.01); *H01L 21/0234* (2013.01); *H01L 21/0245* (2013.01); *H01L 21/02164* (2013.01); *H01L 21/02214* (2013.01); *H01L 21/02274* (2013.01); *H01L 21/02329* (2013.01); *H01L 21/02488* (2013.01); *H01L 21/02507* (2013.01); *H01L 21/02532* (2013.01); *H01L 21/02592* (2013.01)

(56) References Cited

U.S. PATENT DOCUMENTS

| | | |
|---|---|---|
| 9,117,668 B2 | 8/2015 | Hollister et al. |
| 2006/0046519 A1* | 3/2006 | Tsuji .................... C23C 16/401 438/778 |
| 2006/0097305 A1 | 5/2006 | Lee |
| 2007/0145465 A1* | 6/2007 | Lee .................... H01L 21/28273 257/315 |
| 2008/0026597 A1 | 1/2008 | Munro et al. |
| 2009/0026249 A1* | 1/2009 | Kopp .................... B23K 1/0016 228/223 |
| 2009/0115311 A1* | 5/2009 | Joshi ...................... C23C 16/24 313/498 |
| 2011/0252899 A1* | 10/2011 | Felts ...................... A61L 31/10 73/865.8 |
| 2012/0142172 A1 | 6/2012 | Fox et al. |
| 2013/0316518 A1* | 11/2013 | Hollister ............ H01L 21/0245 438/478 |
| 2016/0260602 A1 | 9/2016 | Sreekala et al. |
| 2018/0069023 A1* | 3/2018 | Ma .................... H01L 21/02164 |

OTHER PUBLICATIONS

L.Zajickova et al., 'Characterization of silicon oxide thin films deposited by plasma enhanced chemical vapour deposition from octamethylcyclotetrasiloxane-oxygen feeds', Thin Solid Films, vol. 338, Issues 1-2, pp. 49-59, Oct. 18, 1999 (https://doi.org/10.1016/S0040-6090(98)00976-6).

* cited by examiner

LOW DIELECTRIC CONSTANT OXIDE AND LOW RESISTANCE OP STACK FOR 3D NAND APPLICATION

CROSS-REFERENCE TO RELATED APPLICATIONS

This application claims benefit of U.S. Provisional Patent Application Ser. No. 62/490,725, filed on Apr. 27, 2017, which is herein incorporated by reference in its entirety.

BACKGROUND

Field

Embodiments of the present disclosure generally relate to memory manufacturing processes, and more particularly, to methods of manufacturing 3D memory cells having a low dielectric constant and reduced resistivity.

Description of the Related Art

Growing demands continue to drive the need for high-capacity, high-performance computer memory devices with smaller geometries at lower costs. To this end, components of memory cells are stacked on top of each other to create three-dimensional (3D) memory cells, such as vertical gate 3D memory cells. One such technology is NAND flash memory, which is generally found in memory cards, USB flash drives, solid-state drives, and other similar devices for data storage and transfer. In NAND flash memory, memory cells made from transistors are connected in series and stacked in vertical layers to create densely-packed, high-capacity memory devices. Flash drives generally use less power and are more durable than ordinary hard drives because they do not contain moving parts. As such, there is great interest in increasing the capacity of flash drives, while reducing their size and cost.

As flash technology has progressed, limitations have continued to exist in how to create high-capacity devices on a small scale. For example, different materials that are combined on a microscopic scale have different physical properties that lead to non-uniformities in the flash memory device. Many vertical 3D memory cells include oxide/polysilicon (OP) stacks and/or oxide/nitride (ON) stacks due to their integration properties. Problematically, however, the oxide material generally has a high dielectric constant and resistive-capacitive (RC) delay, and the polysilicon material has a high resistivity.

Therefore, there is a need for improved methods of manufacturing memory structures, such as 3D memory cells, having a low dielectric constant and reduced resistivity.

SUMMARY

Embodiments described herein generally relate to methods of manufacturing an oxide/polysilicon (OP) stack of a 3D memory cell for memory devices, such as NAND devices. The methods generally include treatment of the oxide and/or polysilicon materials with precursors during PECVD processes to lower the dielectric constant of the oxide and reduce the resistivity of the polysilicon. In one embodiment, the oxide material is treated with octamethylcyclotetrasiloxane (OMCTS) precursor. In another embodiment, germane (GeH$_4$) is introduced to a PECVD process to form doped Si$_x$Ge$_{(1-x)}$ films. In yet another embodiment, a plasma treatment process is used to nitridate the interface between layers of the OP stack. The precursors and plasma treatment may be used alone or in any combination to produce OP stacks with low dielectric constant oxide and low resistivity polysilicon.

In one embodiment, a memory cell manufacturing method is described. The method includes positioning a substrate in a PECVD chamber, introducing octamethylcyclotetrasiloxane precursor to the PECVD chamber to deposit a silicon oxide layer over the substrate, and depositing a polysilicon layer over the silicon oxide layer.

In another embodiment, a memory cell manufacturing method is described. The method includes positioning a substrate in a PECVD chamber, depositing a silicon oxide layer over the substrate, and introducing a silicon precursor and germane to the PECVD chamber to form a SixGe(1-x) film over the silicon oxide layer.

In yet another embodiment, a memory device is described. The memory device includes a substrate, a silicon oxide layer disposed over the substrate, the silicon oxide layer having a dielectric constant between about 2.5 and about 3.2, and a polysilicon layer disposed over the silicon oxide layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments described herein generally relate to methods of manufacturing an oxide/polysilicon (OP) stack of a 3D memory cell for memory devices, such as NAND devices. The methods generally include treatment of the oxide and/or polysilicon materials with precursors during PECVD processes to lower the dielectric constant of the oxide and reduce the resistivity of the polysilicon. In one embodiment, the oxide material is treated with octamethylcyclotetrasiloxane (OMCTS) precursor. In another embodiment, germane (GeH$_4$) is introduced to a PECVD process to form doped Si$_x$Ge$_{(1-x)}$ films. In yet another embodiment, a plasma treatment process is used to nitridate the interface between layers of the OP stack. The precursors and plasma treatment may be used alone or in any combination to produce OP stacks with low dielectric constant oxide and low resistivity polysilicon. The present disclosure contemplates an OP stack memory device as an example; however, other memory stacks also benefit from methods described herein.

Figure 1:
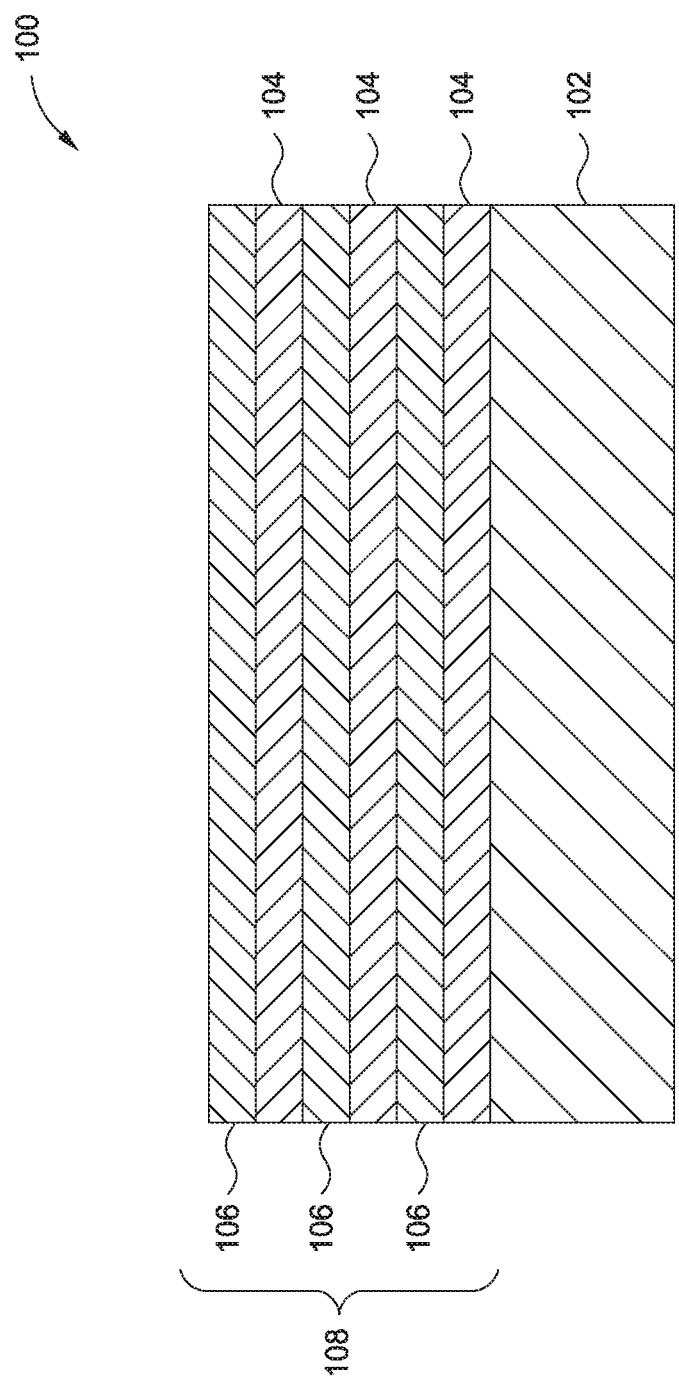
FIG. 1 is a cross-sectional view of a memory device according to embodiments of the present disclosure.

FIG. 1 is a memory device 100 according to embodiments of the present disclosure. The memory device 100 includes a substrate 102 with a plurality of first material layers 104 and a plurality of second material layers 106 thereon. The plurality of first material layers 104 and the plurality of second material layers 106 make up a memory stack 108. In the embodiment of an OP stack memory device, each of the first material layers 104 is generally a silicon oxide layer (O layer) and each of the second material layers 106 is generally an amorphous silicon layer, which becomes a polysilicon layer (P layer) after an annealing process. While FIG. 1 depicts the second material layer 106 deposited over the first material layer 104, the deposition order may be reversed such that the first material layer 104 (O layer) is deposited over the second material layer 106 (P layer).

While memory device 100, as shown, includes three first material layers 104 and three second material layers 106, the number of first material layers 104 and second material layers 106 is generally any suitable number of layers depending upon the memory device being manufactured. For example, memory devices often include 8×, 16×, 24×, and even higher stack numbers.

In an embodiment in which the memory device 100 is a NAND flash memory cell, the memory device 100 further includes a source and a drain disposed on opposite ends of a first surface of the substrate 102. For use as flash memory, multiple NAND flash cells are generally connected in series with the adjacent cells sharing a source or drain, and each cell is connected to a bitline and a wordline. In operation, each cell can store data, such as a "0" or "1," therein.

The methods of manufacturing memory devices, such as memory device 100, that follow are generally part of plasma-enhanced chemical vapor deposition (PECVD) process, which can be used to form silicon films at relatively low temperatures. The methods can be performed in any suitable PECVD chamber, such as PECVD chambers available from Applied Materials, Inc. of Santa Clara, Calif.

Figure 2:
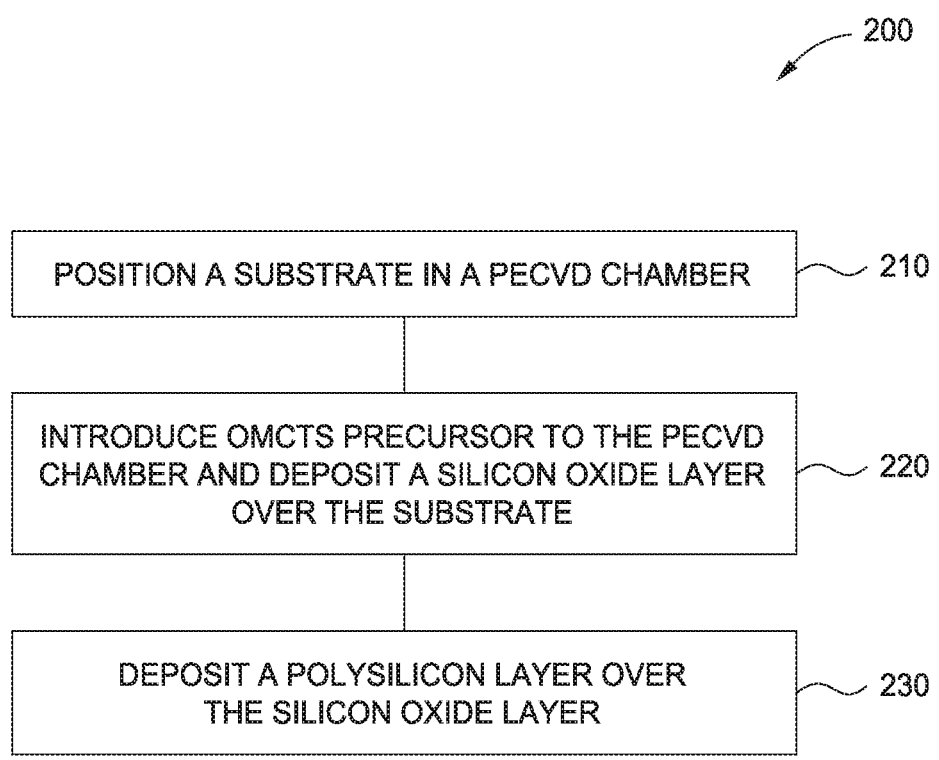
FIG. 2 is a flow diagram summarizing a method according to embodiments of the present disclosure.

FIG. 2 depicts a flow diagram summarizing a method 200 of manufacturing a memory device, such as the memory device 100. The method 200 begins at operation 210 by positioning the substrate 102 in a PECVD chamber. At operation 220, a first material layer 104, or silicon oxide layer, is deposited over the substrate 102 by introducing OMCTS precursor to the PECVD chamber. The chemical structure of OMCTS precursor is shown below as Structure 1. In one embodiment, the first material layer 103 is deposited on and in contact with the substrate 102.

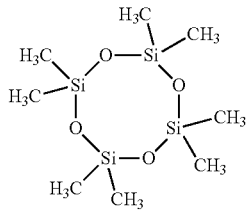

(Structure 1)

As shown in Structure 1, an OMCTS molecule is a chemical structure having silicon oxide (Si—O) ring-like bonding, in addition to methyl ($CH_3$) groups. Conventionally deposited silicon oxide layers have a dielectric constant of about 3.9. According to embodiments of the present disclosure, the carbon (C) from the above-described introduction of OMCTS precursor generally reduces the dielectric constant of the silicon oxide layer from its current value of about 3.9 to between about 2.5 and about 3.2, for example, to between about 2.8 and about 3.0. Additionally, the deposited silicon oxide layer has increased oxide quality through the Si—O ring-like structure.

Adjusting the processing conditions of the PECVD process will break C—H bonds of the OMCTS precursor. For example, increasing a plasma density during introduction of the OMCTS precursor to the PECVD chamber from about 25.56 megahertz (MHz) to about 27 MHz breaks the C—H bonds of the precursor. Additionally, or alternatively, the method 300 further includes bombarding the silicon oxide layer with a radiofrequency (RF frequency) of between about 300 kHz and about 400 kHz, such as about 350 kHz, to break the C—H bonds of the OMCTS precursor.

At operation 230, a second material layer 106, or polysilicon layer is deposited over the first material layer 104, or silicon oxide layer. The second material layer 106 may be deposited by any suitable deposition means. Generally, amorphous silicon is deposited by the introduction of precursors, including but not limited to, silane ($SiH_4$), argon (Ar), and helium (He), in addition to dopant precursors, including but not limited to, phosphane ($PH_3$) and diborane ($B_2H_6$). The amorphous silicon becomes polysilicon after an annealing process, such as a thermal anneal. In one embodiment, the second material layer 106 is deposited on and in contact with the first material layer 104.

Operations 220 and 230 are optionally repeated to form an OP stack having any number of first material layers 104 and any number of second material layers 106.

Figure 3:
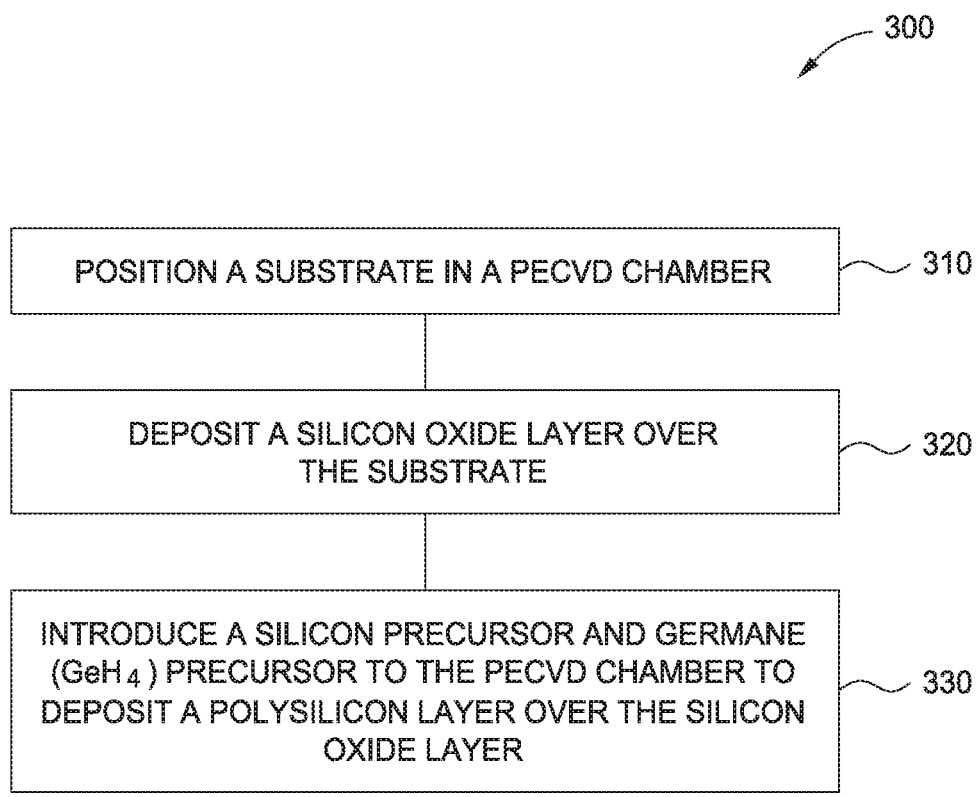
FIG. 3 is a flow diagram summarizing a method according to embodiments of the present disclosure.

FIG. 3 depicts a flow diagram summarizing a method 300 of manufacturing the memory device 100. The method 300 begins at operation 310 by positioning the substrate 102 in a PECVD chamber. At operation 320, a first material layer 104, or silicon oxide layer, is deposited over the substrate 102. The silicon oxide layer is generally deposited by any suitable deposition process, such as the process described at operation 220 of method 200. In one embodiment, the first material layer 104 is deposited on and in contact with the substrate 102.

At operation 330, a second material layer 106, or polysilicon layer, is deposited over the first material layer 104. More specifically, the polysilicon layer is deposited by introducing at least one silicon precursor, including but not limited to, silane ($SiH_4$), and germane ($GeH_4$) precursor to form a $Si_xGe_{(1-x)}$ film having dopant therein, which has high mobility and low resistivity. An example of a suitable dopant is phosphine ($PH_3$). The $GeH_4$ precursor may be introduced at any suitable time during the PECVD process. In one embodiment, $GeH_4$ is introduced before plasma is generated in the PECVD chamber.

The deposited polysilicon has high mobility and reduced resistivity with the same, or a substantially similar, carrier concentration. Conventionally deposited n-type polysilicon (with phosphorous (P) doping) has a resistivity of about $1 \times 10^{-3}$ ohm*cm, and conventionally deposited p-type polysilicon has a resistivity of about $3 \times 10^{-3}$ ohm*cm. The introduction of $GeH_4$ precursor reduces the resistivity of the n-type polysilicon film to about $0.5 \times 10^{-3}$ ohm*cm, and the resistivity of the p-type polysilicon film to about $1.5 \times 10^{-3}$ ohm*cm.

Operations 320 and 330 are optionally repeated to form an OP stack having any number of first material layers 104 and any number of second material layers 106.

Additionally or alternatively, methods described herein may include plasma treatment at an interface between the first material layer 104, or silicon oxide layer, and the second material layer 106, or polysilicon layer. More specifically, the interface between each of the silicon oxide layers and polysilicon layers may undergo plasma treatment to nitridate and improve adhesion between the layers of the OP stack. For example, ammonia ($NH_3$)/nitrogen gas ($N_2$) plasma may be generated in the PECVD chamber to nitridate and improve adhesion at the interface between the silicon oxide and polysilicon layers.

The operations of method 200 and method 300 can be used in any combination. In one further embodiment, a first material layer 104, or silicon oxide layer, is deposited over the substrate 102 by introducing OMCTS precursor, and a second material layer 106 is deposited by introducing at least one silicon precursor, including but not limited to, $SiH_4$, and germane ($GeH_4$) precursor to form $Si_xGe_{(1-x)}$ film with dopant. These operations are repeated to form a memory device having any suitable number of layers.

Methods described herein provide improved memory devices having low dielectric constant oxide and low resistivity polysilicon with reduced thickness, which improves overall device extendibility while maintaining continued shrinking of overall memory device geometries.

While the foregoing is directed to embodiments of the present disclosure, other and further embodiments of the disclosure may be devised without departing from the basic scope thereof, and the scope thereof is determined by the claims that follow.

What is claimed is:

1. A method of manufacturing a memory device stack, comprising: positioning a substrate in a PECVD chamber; introducing octamethylcyclotetrasiloxane precursor to the PECVD chamber to deposit a silicon oxide layer over the substrate; bombarding the silicon oxide layer with an RF frequency of between about 300 kHz and about 400 kHz; and depositing a polysilicon layer over the silicon oxide layer, wherein the presence of carbon from the octamethylcyclotetrasiloxane precursor in the silicon oxide layer reduces the dielectric constant of the silicon oxide layer to between about 2.8 and about 3.0.

2. The method of claim 1, wherein the depositing the polysilicon layer over the silicon oxide layer comprises:
   introducing silane and germane to the PECVD chamber to deposit the polysilicon layer.

3. The method of claim 1, wherein the introducing octamethylcyclotetrasiloxane precursor to the PECVD chamber to deposit the silicon oxide layer over the substrate occurs at a plasma density of about 27 megahertz.

4. The method of claim 1, further comprising:
   plasma treating an interface between the silicon oxide layer and the polysilicon layer, wherein the plasma treating comprises introducing $NH_3/N_2$ to the PECVD chamber.

5. The method of claim 1, wherein depositing the polysilicon layer over the silicon oxide layer comprises:
   introducing one or more precursors selected from a group consisting of silane, argon, and helium, and one or more dopant precursors selected from a group consisting of phosphine and diborane, to the PECVD chamber to deposit an amorphous silicon layer over the silicon oxide layer; and
   annealing the amorphous silicon layer to form the polysilicon layer.

6. The method of claim 1, wherein depositing the polysilicon layer over the silicon oxide layer comprises:
   introducing at least one silicon precursor selected from the group consisting of silane and germane to the PECVD chamber to form a $Si_xGe_{(1-x)}$ film.

7. The method of claim 1, wherein the RF frequency is 350 kHz.

* * * * *